Figure 1:
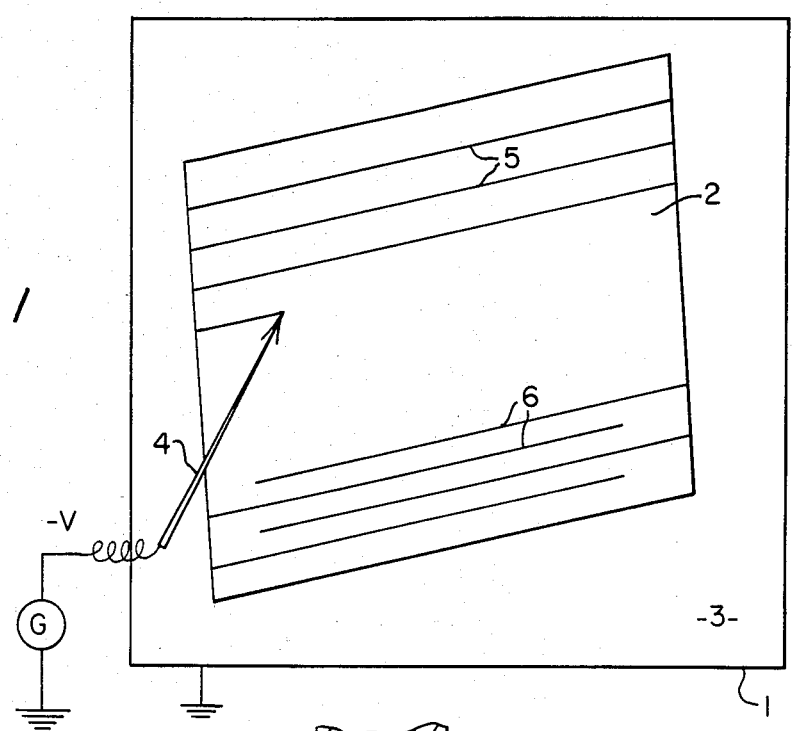

United States Patent [19]

Solomon et al.

[11] Patent Number: 4,634,826
[45] Date of Patent: Jan. 6, 1987

[54] METHOD FOR PRODUCING ELECTRIC CIRCUITS IN A THIN LAYER, THE TOOL TO IMPLEMENT THE METHOD, AND PRODUCTS OBTAINED THEREFROM

[75] Inventors: Ionel Solomon, Boulogne; Jacques Méot, Paris; Patrick Meligne, Mennecy, all of France

[73] Assignee: Solems S.A., France

[21] Appl. No.: 703,571

[22] Filed: Feb. 20, 1985

[30] Foreign Application Priority Data

Feb. 20, 1984 [FR] France .................. 84 02490

[51] Int. Cl.$^4$ .................. H01L 21/326; B23H 7/02
[52] U.S. Cl. .................. 219/69 M; 29/584; 204/206; 204/224 M; 219/68; 219/69 W
[58] Field of Search .................. 219/69 M, 69 R, 68, 219/69 W; 204/129.3, 129.65, 206, 224 M; 29/584–586

[56] References Cited

U.S. PATENT DOCUMENTS

| | | |
|---|---|---|
| 2,248,057 | 7/1941 | Bond .................. 219/69 R |
| 2,785,280 | 3/1957 | Eisler et al. .................. 219/69 M |
| 2,903,557 | 9/1959 | Matulaitis .................. 219/69 W |
| 3,073,943 | 1/1963 | Girling et al. .................. 204/129.3 |
| 3,119,919 | 1/1964 | Pratt .................. 219/68 |
| 3,305,666 | 2/1967 | Zaromb .................. 219/69 M |
| 3,324,276 | 6/1967 | Osenbruggen et al. .................. 219/69 V |
| 3,678,348 | 7/1972 | Reber et al. .................. 204/129.65 |
| 3,895,207 | 7/1975 | Heywang et al. .................. 219/68 |
| 3,895,208 | 7/1975 | Kraus .................. 219/68 |
| 3,902,979 | 9/1975 | Thomas .................. 204/129.65 |
| 4,104,090 | 8/1978 | Pogge .................. 204/129.3 |
| 4,409,075 | 10/1983 | Kolbesen .................. 204/129.65 |
| 4,532,700 | 8/1985 | Kinney et al. .................. 204/129.3 |
| 4,554,059 | 11/1985 | Short et al. .................. 204/129.3 |

FOREIGN PATENT DOCUMENTS

| | | |
|---|---|---|
| 786474 | 5/1968 | Canada .................. 219/69 M |
| 1155497 | 10/1963 | Fed. Rep. of Germany ... 219/69 M |
| 977587 | 4/1951 | France . |
| 187981 | 11/1982 | Japan .................. 219/69 M |
| 805291 | 12/1958 | United Kingdom . |
| 972048 | 10/1964 | United Kingdom . |
| 1225676 | 3/1971 | United Kingdom . |

OTHER PUBLICATIONS

"Manufacture of Circuit Boards Utilizing Electroerosion and an Automatic Drafting Table" by Uberbacher, IBM Tech. Discl. Bulletin, vol. 19, No. 2, 1976, pp. 575, 576.

"Printed Circuit Deletion Using Capacitor Discharge", by Funari et al., IBM Technical Disclosure Bulletin, vol. 24, No. 12, May 1982.

Primary Examiner—A. D. Pellinen
Assistant Examiner—Geoffrey S. Evans
Attorney, Agent, or Firm—Pollock, VandeSande & Priddy

[57] ABSTRACT

Thin-layered conductive or semi-conductive electric circuits are made on a thin conductive or semi-conductive layer that was previously deposited on an electric insulating substrate. The electric circuits are produced by attacking with an electro-erosion tool the thin layer so as to form insulated paths thereon.

8 Claims, 3 Drawing Figures

METHOD FOR PRODUCING ELECTRIC CIRCUITS IN A THIN LAYER, THE TOOL TO IMPLEMENT THE METHOD, AND PRODUCTS OBTAINED THEREFROM

This invention pertains to the production of electric circuits which are comprised of a thin conductive or semi-conductive layer that is deposited on an insulated electric substrate.

Applicants are familiar with various methods used to produce electric circuits of the previously mentioned type.

According to a known method, masks are used to protect the thin conductive or semi-conductive layer on specific ranges and to attack it according to the pre-set arrangement; this method frequently calls for photographic techniques; circuit manufacturing operations however are fairly complicated and on the other hand, they lack flexibility in the execution of circuits which depend on the execution of masks.

According to another known method, which can also yield good results, laser methods are used in order to destroy accurately at desired locations the thin conductive or semi-conductive layer which is deposited on its substrate; this method makes it possible to draw circuits accurately; however, this method also has the disadvantage of requiring a costly apparatus.

Applicants also are familiar with matter removal methods, for instance through electro-erosion, which makes it possible to execute printed conductive circuits produced inside a thin metal layer that is deposited on an insulating substrate; those methods are restricted to the conductive nature of the thin layer, which is usually made of copper, and that does not make it possible either to determine accurately the characteristics of the cut or to obtain reinforced insulation on either side of this cut.

The purpose of the invention is to make it possible, from a simple apparatus, which is not costly, and that is easy to implement, to create electric circuits with any type of desired configuration and of excellent quality, especially for electric insulation.

To this end, the method for producing electric circuits comprised of a thin conductive or semi-conductive layer that is deposited on an electric insulating substrate starts from a thin continuous layer, which is deposited on the substrate, and in which cut-outs, attacks or removals are made to produce said circuit, is characterized according to the invention in that said cut-out, attack or removal, operations are performed with an electro-erosion method in an environment of which the make-up has been selected, so that under the action of the electric micro-arc which is created in that environment, between the tip of an electro-erosion tool and said thin conductive layer, there should be, at that location, the forming of a new chemical compound, said compound is an electric insulator.

Thus, with an appropriate electrochemical and dielectric selection of the environment, associated to the thin conductive or semi-conductive layer in use, it is possible, with an electro-erosion method that is very simple to implement, to produce inside said thin layer, any pattern for desired circuits, perfectly insulated with a type of insulating cord thus manufactured on site.

Figure 3:
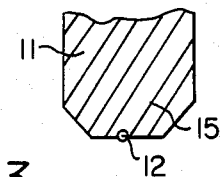
Figure 2:
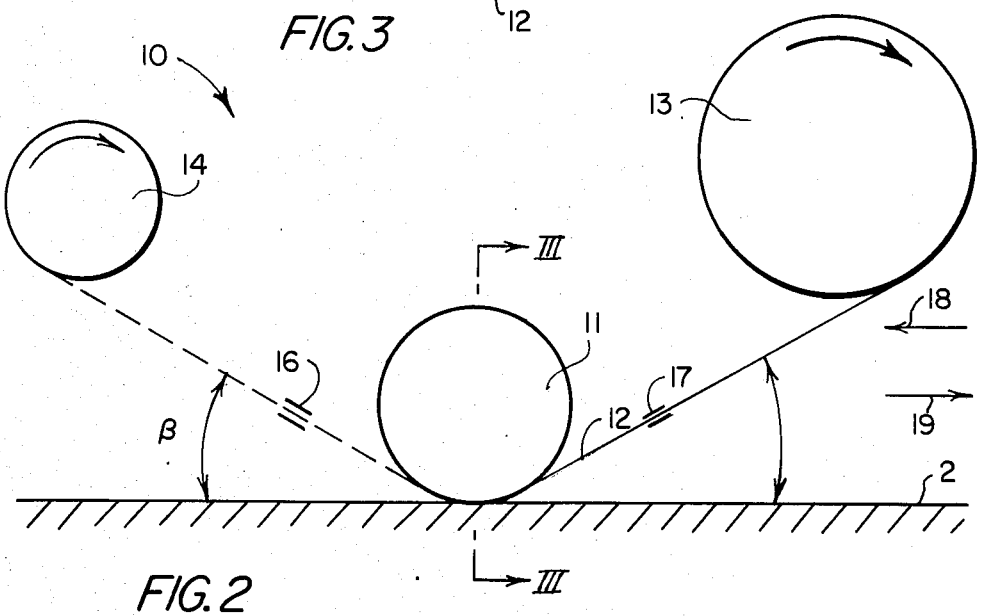

The invention and its implementation shall be more apparent with the description that follows which is provided as a reference to the attached drawings wherein:

FIG. 1 schematically depicts a possible implementation of the invention;

FIG. 2 schematically depicts an appropriate tool for implementing the method;

FIG. 3 depicts a section through the tip of the tool, which is performed more or less in plane III—III of FIG. 2.

According to the execution example shown in FIG. 1, inside a vat 1 is placed a plate 2 submerged in an environment 3 that is made of a dielectric or electrolytic liquid. The plate 2 for instance is a plate that includes a glass substrate on which a thin conductive or semi-conductive layer was deposited, for example $SnO_2$ or tin-doped indium oxide abbreviated as: ITO ("indium tin oxide"). The thickness of those layers can range from 700 to 8000 Angstroms (A) (or $7.10^{-5}$ mm to $8.10^{-4}$ mm).

The deposit can be obtained by any appropriate means such as a chemical deposit, coating, vacuum projection, evaporation, pulverizing, etc.

Moreover, the electro-etching tool, for instance an electric conductive stylus 4, is connected to a negative source with $-V$ voltage of a generator G of which the mass is connected, either to the vat, or to the layer to be etched.

In the example shown, the environment in which the reaction takes place is water.

In order to obtain the attack by electro-etching of the thin conductive or semi-conductive layer, the tip of the electrode 4 is applied onto the plate and it is shifted according to the desired path, for instance lines such as 5 which cross the plate from one end to another in order to produce separate parallel circuits, or lines such as 6 which lead alternately onto one slice and another of the plate so as to produce a series circuit, or according to any other desired pattern. In the example shown, the lines 5, 6 represent insulating cords, of which the chemical nature appears complex, but its resistance always exceeds $2.10^6$ ohms. In layers where resistance per surface unit is included between 10 and 50 ohms, the minimal voltages (threshold voltage) average about 40 volts and currents involved range between 30 and 150 mA.

In layers where resistance per surface unit exceeds 50 ohms, threshold voltages vary between 60 and 150 V; however, currents involved remain between 30 and 150 mA.

The width of the scratches is a direct function of the etching voltage, the displacement velocity and the profile of the tool. It is usually included between 50 and 200 microns, the thinnest scratches are obtained on the layers with the highest resistance per surface unit.

Regardless of the type of material to etch, the insulation on either side of a scratch by the produced insulating cord exceeds $2 \times 10^6$ ohms.

If an electrolyte or a dielectric liquid, or a gel which appropriately wets the layer to be etched, or a dry film is used, it is possible not to use the vat, provided the environment in which electro-erosion takes place favors production at the level of the conductive or semi-conductive layer of the insulating cord. It should be appreciated that it is assumed, at the level of that film, a phenomenon is obtained whereby the electro-erosion arc is stabilized and also there is participation in the chemical reaction designed to alter the nature of the layer to be treated which leads to the production of an insulating cord at the level of the cut formed by electroerosion.

As an environment, we can use a water/ethanol mixture which produces a film that appropriately wets the layer to be attacked. In that instance, we simply have to connect a band from generator G for instance the mass, to the layer to be etched, and the other generator band to the tool 4 of which the tip is applied to the plate. The electric micro-arc which is produced at the tip of the tool destroys at that location, through an electrochemical reaction with the water-ethanol electrolyte, the thin semi-conductive layer, thereby achieving the desired circuit.

Obviously, several tools can be put to parallel use, and they can adopt various shapes such as a wire, blade or any other conductive object of which a small section can be applied to a specific length of the conductive or semi-conductive layer to be attacked.

A particularly appropriate example of a tool is schematically shown in FIGS. 2 and 3.

The tool referred to as a whole by 10 basically includes an electric insulating roller 11 crossed by a metal wire 12 which is drawn tautly between a wire supply bobbin 13 and a wire return bobbin 14. The section of metal wire 12 and the groove 15, which is produced in the roller 11, are selected so that the wire 12 protrudes beneath the lower side of the roller 11, as clearly shown in FIG. 3. The wire is advantageously guided at the roller 11 entry and exit by wire-guides 16, 17. Angles $\alpha, \beta$ which the wire forms with the surface of the plate 2 to be attacked can equal about 30 degrees for instance.

In one test, the metal wire had a diameter which ranged from 8 to 12 hundredths of a millimeter and it protruded by about half of its diameter beneath the surface of the roller 11.

The roller and bobbins 13 and 14 are mounted on a support platen (not depicted). Practically speaking, the tool, and therefore the wire 12, is applied against the plate 2. The tool is shifted parallel to the wire length, or in the direction of arrows 18 or 19 to produce insulating scratches in the plate 2. After the forming of each scratch by unrolling the wire on ½ to 1 millimeter, the principle of a supplied wire makes it possible to immediately obtain a new tool tip. Application pressure can range from 100 to 700 grams and wire stress can be kept between 50 and 500 grams. The curved shape of the tool tip favors use of the tool and it makes it possible to compensate for the plane deficiencies of the substrate. With a plate 2 that is covered with a layer of $SnO_2$, good results were obtained by using supply voltage on the tool tip equal to 100 volts and by using as a reactive dielectric environment a thin layer of water. Implemented currents equal about 100 milliamps.

We claim:

1. A method of producing desired electric circuits in a thin layer having certain electrical conductivity, comprising the steps of:
   depositing the thin layer onto an insulating electric substrate;
   submerging the thin layer into an environment which, when properly stimulated, is capable of electro-chemically changing the chemical composition of the thin layer;
   applying the tip of an electro-erosion tool to the thin layer for producing between the tip and the thin layer an electro-erosion arc, the arc and the environment electro-chemically changing the thin layer at the point of the arc contact for producing an insulating compound having chemical composition different from the thin layer at the contact point thereof; and
   moving the tool in relation to the thin layer along a predetermined insulation path for producing in the thin layer the desired circuits.

2. The method according to claim 1, wherein the applying step further comprises the steps of:
   adjusting the dimension of the arc; and wherein the adjusting step further including:
   adjusting the electrical resistance per surface unit of the thin layer; and
   adjusting the profile and the displacement velocity of the tool.

3. The method according to claim 2, wherein the applying step further comprises:
   applying a voltage of approximately 40–150 volts and a current of approximately 30–150 mA to the tip of the electro-erosion tool.

4. The method according to claim 3, wherein the submerging step further comprises:
   submerging the thin layer in an environment including one of a group of an electrolyte and a dielectric liquid.

5. The method according to claim 4, further comprising:
   submerging the thin layer into a composition of water and ethanol.

6. The method according to claim 5, wherein the depositing step further comprises:
   depositing the thin layer onto glass.

7. A method of producing desired electric circuits in a thin layer having certain electrical conductivity, comprising the steps of:
   depositing the thin layer onto an insulating electric substrate;
   submerging the thin layer into an environment which, when properly stimulated, is capable of electro-chemically changing the chemical composition of the thin layer;
   applying the tip of an electro-erosion tool to the thin layer for producing between the tip and the thin layer an electro-erosion arc, the arc and the environment electro-chemically changing the thin layer at the point of the arc contact for producing an insulating compound having chemical composition different from the thin layer at the contact point thereof; and
   moving the tool in relation to the thin layer along a predetermined insulation path for producing in the thin layer the desired circuits; wherein the tool includes:
   a supply bobbin;
   a return bobbin;
   a roller interposed between the supply and return bobbins; and
   a metal wire drawn tautly between the bobbins and partially bent around the roller, the wire partially protruding from the roller for producing along its length the electro-erosion tip.

8. The method according to claim 7 wherein the tool of the applying and moving steps further comprises:
   means for guiding the wire between the roller and the bobbins, the guided wire forming on either side of the roller angles with the surface of the substrate.

* * * * *